United States Patent [19]

Tam et al.

[11] Patent Number: 4,957,877

[45] Date of Patent: Sep. 18, 1990

[54] PROCESS FOR SIMULTANEOUSLY FABRICATING EEPROM CELL AND FLASH EPROM CELL

[75] Inventors: Simon M. Tam, Redwood City; Stefan K. C. Lai, Belmont, both of Calif.

[73] Assignee: Intel Corporation, Santa Clara, Calif.

[21] Appl. No.: 274,420

[22] Filed: Nov. 21, 1988

[51] Int. Cl.[5] .............................................. H01L 21/70

[52] U.S. Cl. ........................................ 437/43; 437/44; 437/52; 437/193

[58] Field of Search ...................... 437/43, 52, 44, 193; 357/235; 365/148, 185, 186

[56] References Cited

U.S. PATENT DOCUMENTS

| | | | |
|---|---|---|---|
| 4,203,158 | 5/1980 | Bentehkowksy | 357/23.5 |
| 4,517,732 | 5/1985 | Oshikawa | 437/43 |
| 4,527,259 | 7/1985 | Watanabe | 357/23.5 |
| 4,701,776 | 10/1987 | Perlegos | 357/23.5 |
| 4,745,083 | 5/1988 | Huie | 357/23.5 |
| 4,782,424 | 10/1988 | Holler et al. | 437/29 |
| 4,804,637 | 2/1989 | Smayling et al. | 437/52 |
| 4,822,750 | 4/1989 | Perlegos | 437/43 |

*Primary Examiner*—Brian E. Hearn
*Assistant Examiner*—T. Thomas
*Attorney, Agent, or Firm*—Blakely, Sokoloff, Taylor & Zafman

[57] ABSTRACT

Improved processing which permits the simultaneous fabrication of block erasable flash EPROM cells and individually erasable EEPROM cells. A polysilicon finger extends from the floating gate of the EEPROM cell over a tunnel oxide region. Doped regions are formed under this finger by implanting dopants in alignment with the finger during the implantation of the source and drain regions for the cells and then driving the dopant under the finger. The arsenic dopant used to form the source and drain regions for the cells is used to form the doped regions along with the phosphorus dopant used for the source region of the flash EPROM cells.

13 Claims, 3 Drawing Sheets

POLY 2 19a POLY1 18a 11a 11a F. OX F. OX 22a DRAIN SOURCE 24a 23a SUBSTRATE P-TYPE 10

19b POLY 2 11b 11b POLY 1 18b 17b F. OX F. OX 22b 24b 23b SUBSTRATE P-TYPE 10

FIG_1
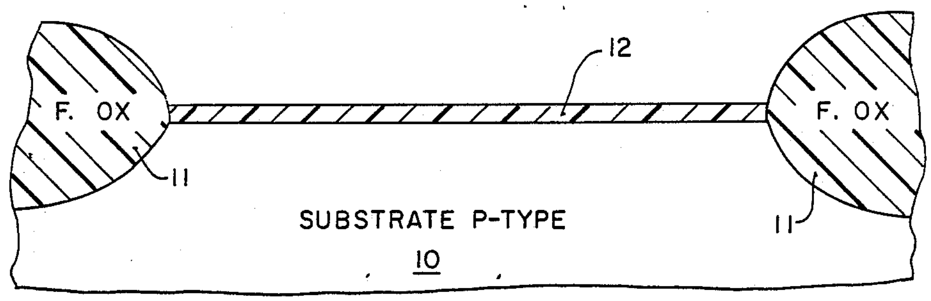
FIG_2A
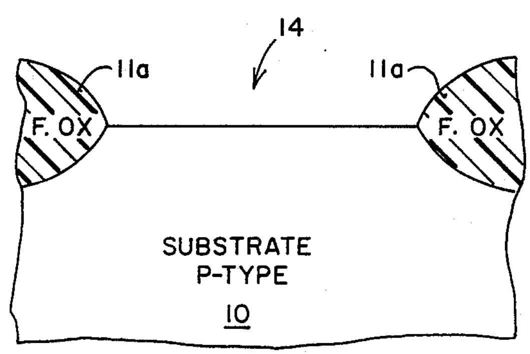
FIG_2B
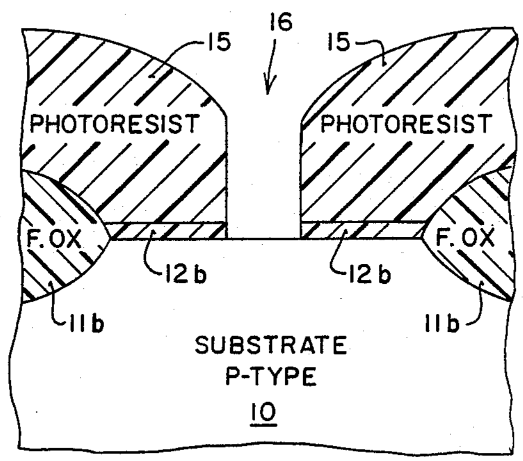
FIG_3A
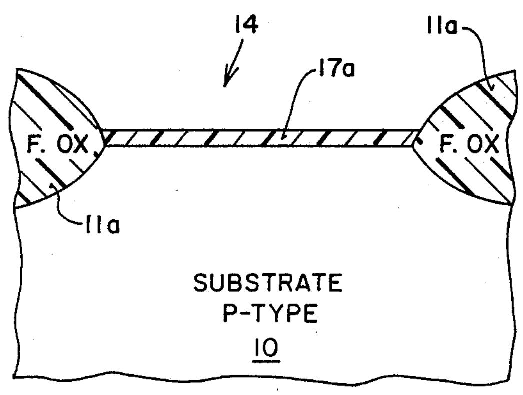
FIG_3B
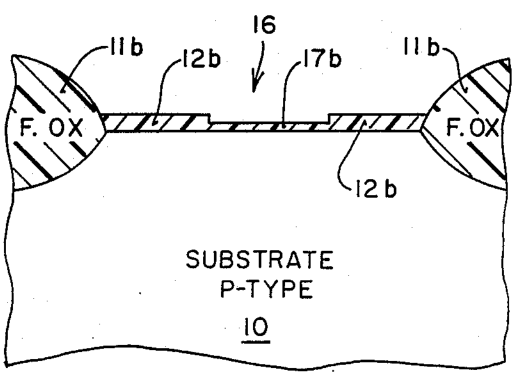

FIG_4A
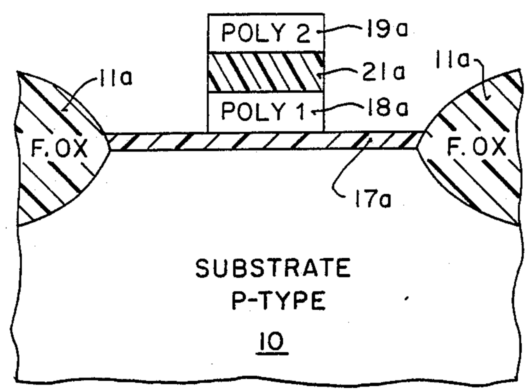
FIG_4B
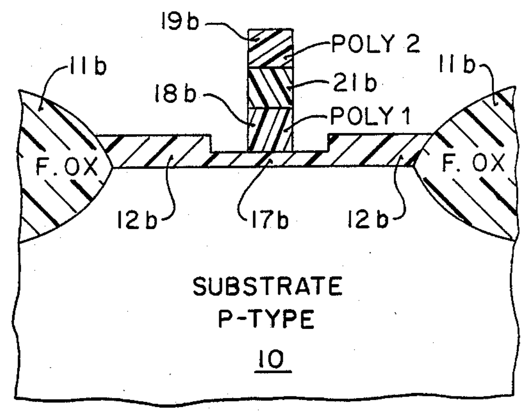
FIG_5A
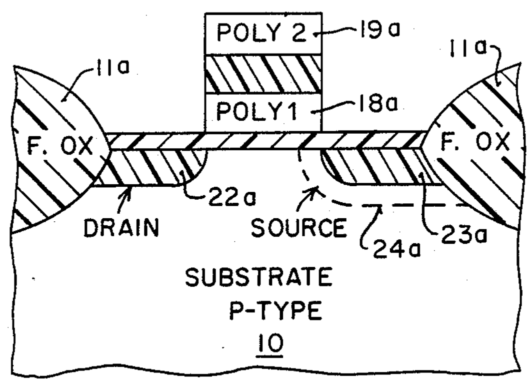
FIG_5B
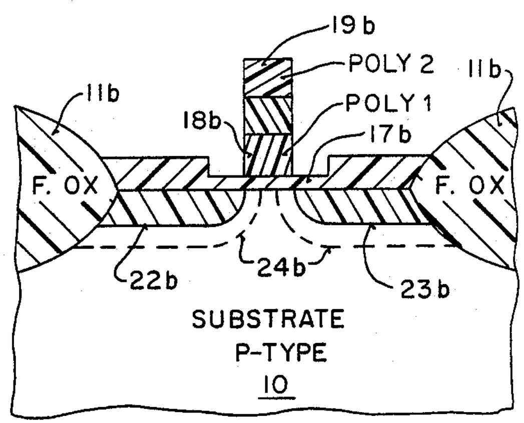

FIG_6
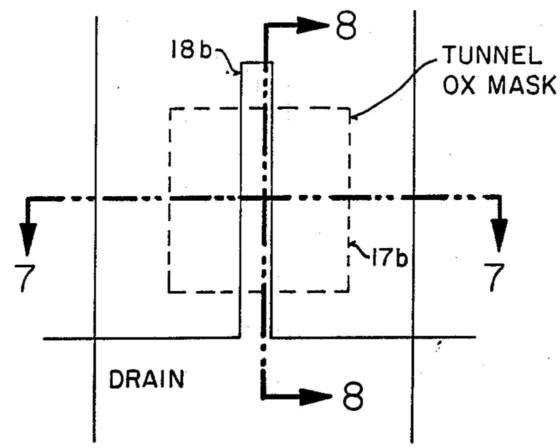
FIG_7
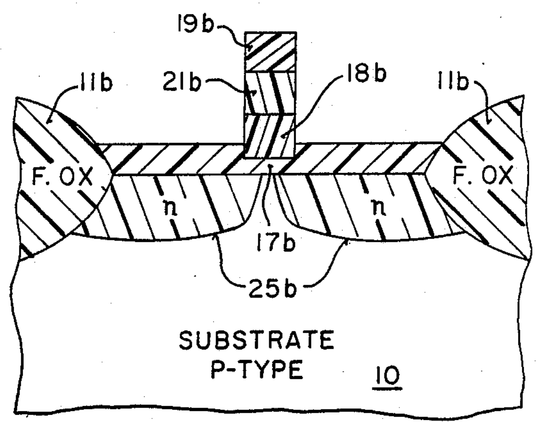
FIG_8
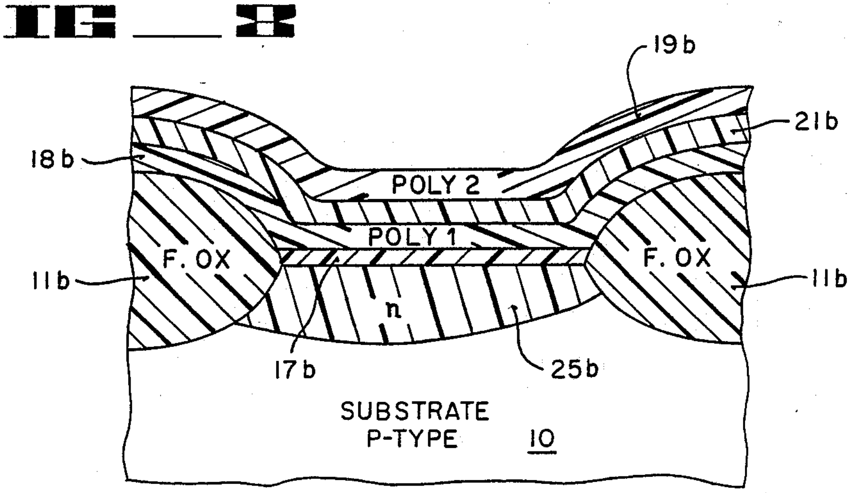
FIG_9
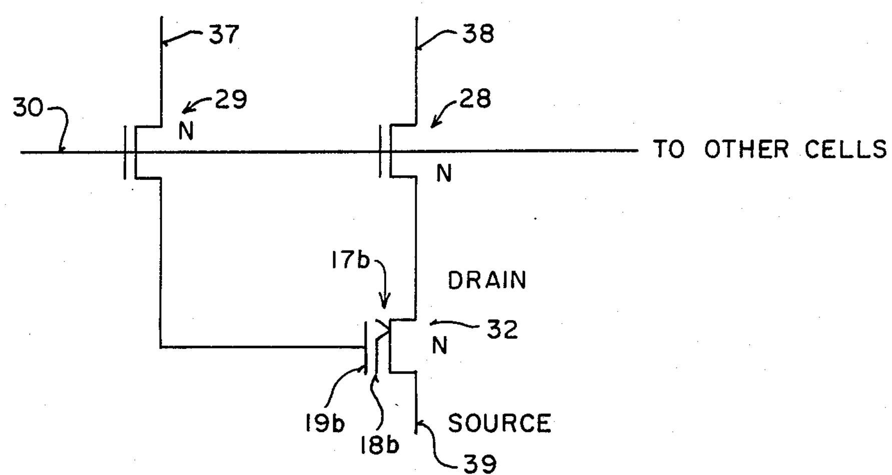

PROCESS FOR SIMULTANEOUSLY FABRICATING EEPROM CELL AND FLASH EPROM CELL

BACKGROUND OF THE INVENTION

1. Field of the Invention

The invention relates to the field of floating gate memory devices particularly those fabricated with metal-oxide-semiconductor technology.

2. Prior Art

For many years now, metal-oxide-semiconductor (MOS) technology has been used to fabricate electrically programmable read-only memories (EPROMs). Many of these cells employ floating gates, that is, generally polysilicon members completely surrounded by an insulator. Electrical charge is transferred into the floating gate through a variety of mechanisms such as avalanche injection, channel injection, Fowler-Nordheim tunnelling, hot electron injection from the substrate, etc. Commercial EPROMs with floating gates first used avalanche injection to charge the floating gate; in second generation memories (and most current floating gate EPROM memories) channel injection is used for programming. These memories are erased by exposure to ultraviolet radiation.

Commercial electrically programmable and electrically erasable memories (EEPROMs) generally use a thin oxide region to tunnel charge into and from a floating gate. In a typical memory, a two transistor cell is used. See, for instance, U.S. Pat. No. 4,203,158 for a discussion of such cells and U.S. Pat. No. 4,266,283 for a discussion of related circuitry. These cells do not as readily lend themselves to reduced geometries as do the EPROM cells. Thus, while relatively dense EPROMs are currently available (e.g., 256K) the EEPROMs are not widely available in capacities above 64K.

More recently, the technology for developing a flash EPROM has become known. These memories employ cells which are more like EPROM cells in overall structure. Erasing occurs in some cases by tunnelling charge from the floating gate to the channel region through the gate oxide layer. Flash EPROM cells and a method for fabricating them are disclosed in a co-pending application entitled LOW VOLTAGE EEPROM CELL, Ser. No. 892,446, filed Aug. 4, 1986 and assigned to the assignee of the present application.

The flash EPROM cells described in the above application may be fabricated in very high density since there is only a single device per cell. With these cells erasing occurs in blocks that is, by way of example, all the cells in the array are simultaneously erased. In contrast, the EEPROM cells described in U.S. Pat. No. 4,203,158 have the advantage that individual cells, or small groups of cells, can be separately erased. (In both memories each cell or small group of cells can be separately programmed.) These cells however, use two devices per cell and hence can not be fabricated in as high a density as the flash EPROM cells described in the above mentioned application.

In some cases it is desirable to have both flash EPROM cells and the individually erasable EEPROM cells on the same substrate. In a microprocessor, for instance, a program may be stored in flash EPROM cells. There may be certain data such as constants which needs to be periodically changed. The individually erasable EEPROM cells are ideal for this type of data. (The term individually erasable EEPROM cell is also meant to include a small group of such cells which are erased together such as eight cells storing a digital word.) Generally, the number of individually erasable EEPROM cells needed is small compared to the number of flash EPROM cells and hence there is a large saving in substrate area if the program is stored in the flash EPROM cells and the number of individually erasable EEPROM cells are kept to a minimum.

The present invention describes processing which permits the simultaneous fabrication of the individually erasable EEPROM cells such as described in U.S. Pat. No. 4,203,158 and the flash EPROM cells described in the above mentioned application. No additional masking steps or other processing steps other than those used to fabricate the flash EPROM cells are used to simultaneously fabricate the individually erasable EEPROM cells.

The present invention makes use of lateral diffusion in the substrate to form regions under a polysilicon member. Lateral diffusion is well-known in the prior art and in some prior art processing has been put to advantage. For example, the lateral diffusion of oxygen ions to form a buried oxide region is described in European Patent Office Publication No. 0164281 published on Dec. 11, 1985. The Applicant does not know of any prior art, however, where lateral diffusion has been used to form regions for the tunnelling of charge such as described in the present application.

SUMMARY OF THE INVENTION

In a process for fabricating a block erasable electrically programmable read-only memory cell (flash EPROM cell-first cell) on a silicon substrate, an improvement is described for simultaneously forming an individually electrically erasable and electrically programmable read-only cell (second cell) on the substrate. An insulative region for the second cell is formed on the substrate for the tunnelling of charge for the second cell, simultaneously with the formation of an insulative region (gate insulation) for the first cell. A thin polysilicon member (finger) is formed from a polysilicon layer over the insulative region for the second cell while forming floating gates from this polysilicon layer for both the first and second cells. When the source and drain regions for both the first and second cells are formed, the substrate adjacent to the polysilicon finger is doped. During subsequent driving steps the dopant diffuses under the polysilicon finger forming closely spaced doped regions in the substrate. Charge from the floating gate of the second cell is able to tunnel into and from this doped region from and to the finger thereby permitting the floating gate of the second cell to be both charged and discharged. Importantly, because of the closely spaced regions very little erase current flows. This permits the on-chip generation of the erase/programming potential.

Other aspects of the present invention will be apparent from the following detailed description of the invention.

BRIEF DESCRIPTION OF THE DRAWINGS

FIG. 1 is a cross sectional elevation view of a substrate showing a typical substrate region formed between field oxide (isolation) regions.

FIG. 2*a* illustrates a region such as the one shown in FIG. 1 after the oxide formed between the field oxide regions has been removed.

FIG. **2*b* illustrates a substrate region such as the one shown in FIG. 1** after a masking and etching step where a portion of the oxide disposed between the field oxide regions has been removed.

FIG. **3*a* illustrates the substrate of FIG. 2*a*** after a tunnel oxide region is grown on the substrate.

FIG. **3*b* illustrates the substrate of FIG. 2*b*** after a tunnel oxide region is grown on the exposed portion of the substrate.

FIG. **4*a* illustrates the substrate of FIG. 3*a*** after a polysilicon floating gate, interpolysilicon dielectric and a second polysilicon (control) gate are formed on the substrate over the tunnel oxide region.

FIG. **4*b* illustrates the substrate of FIG. 3*b*** after a first polysilicon member (finger), interpolysilicon dielectric and second polysilicon member are formed over the tunnel oxide region.

FIG. **5*a* illustrates the substrate of FIG. 4*a*** after source and drain regions are formed in alignment with the gate members.

FIG. **5*b* illustrates the substrate of FIG. 4*b*** after doped regions are formed in the substrate in alignment with the polysilicon finger.

FIG. 6 is a planned view illustrating the tunnel oxide mask and polysilicon finger associated with FIGS. **4*b* and 5*b***.

FIG. 7 is a cross sectional elevation view illustrating the polysilicon sandwich structure of FIG. **5*b* after a driving step. This view is taken generally through the section line 7—7 of FIG. 6**.

FIG. 8 is another cross sectional elevation view generally taken through the section line 8—8 of FIG. 6.

FIG. 9 is an electrical schematic illustrating the individually erasable EEPROM cells fabricated with the invented process.

DETAILED DESCRIPTION OF THE INVENTION

A process which permits the simultaneous fabrication of flash EPROM cells and individually erasable EEPROM cells is described. In the following description, numerous specific details are set forth such as specific oxide thicknesses, dopants, etc. in order to provide a thorough understanding of the present invention. It will be obvious however, to one skilled in the art that the present invention may be practiced without these specific details. In other instances, well known processing steps are not set forth in detail in order not to unnecessarily obscure the present invention in detail.

For purposes of the following description, the EEPROM cell shown generally in FIGS. **2*b*, 3*b*, 4*b*, 5*b*, 6, 7, 8 and 9 is referred to as an "individually erasable" EEPROM cell to indicate that the cell may be erased (negative charge removed from the floating gate) without erasing a relatively large block of cells such as occurs with the flash EPROM cells described below. It will be appreciated, however, that in a memory array, particularly one with a "by 8" or "by 16" organization 8 or 16 of the individually erasable cells may be simultaneously erased. This type of organization is shown in U.S. Pat. No. 4,266,283. One distinction between the embodiment of the flash EPROM cell and individually erasable EEPROM cell discussed below, is that the latter cell includes a "select" circuit (two transistors are used for selecting as shown in FIG. 9**) allowing the cell to be isolated for erasing.

The present invention is described in conjunction with the formation of a memory array which includes on the same substrate both flash EPROM and individually erasable EEPROM cells. As will be seen, no additional masking steps are needed for the simultaneous fabrication of both cells. There is also discussion on the simultaneous formation of the peripheral circuits formed on the substrate with these cells and used, for example, to decode address signals, interface between external circuits and the array, etc. In the presently preferred embodiment the entire memory, including the peripheral circuits, are formed employing metal-oxide-semiconductor (MOS) technology and, more specifically, complementary (CMOS) technology. Numerous well-known processes may be used to practice the present invention.

In the following description, some of the steps needed to simultaneously fabricate the individually erasable EEPROM cells while fabricating flash EPROM cells are described. These steps for the flash EPROM cell fabrication are shown in FIGS. **2*a*, 3*a*, 4*a* and 5*a* of the present aplication. The flash EPROM process is described in detail in co-pending application Ser. No. 892,446; filed Aug. 4, 1986 and assigned to the assignee of the present invention. The individually erasable EEPROM cell is described in detail in U.S. Pat. No. 4,203,158. The steps for the simultaneous fabrication of these cells are shown in FIGS. 2*b*, 3*b*, 4*b*, 5*b*, 6, 7 and 8** of the present application.

FIGS. **2*a* and 2*b* show what occurs during the same processing step in the fabrication of the flash EPROM cell and the individually erasable EEPROM cell, respectively. These figures are presented side-by-side to assist in understanding the process flow. The same is true for FIGS. 3*a* and 3*b*, 4*a* and 4*b* and finally 5*a* and 5*b***.

In FIG. 11 of U.S. Pat. No. 4,203,158, there is shown a finger region 73 formed in a substrate. This doped region is disposed below a tunnel oxide region. Charge is tunnelled to and from region 73 into and from a floating gate. This region is doped prior to the formation of the overlying polysilicon members. A finger region 73 cannot be formed for the cell shown in this patent while simultaneously forming the flash EPROM cell without an additional masking step. The present invention, as will be seen, permits the formation of a doped substrate region to receive and provide charge, from and to the floating gate without additional processing.

In the currently preferred processing of the present invention a p-type polysilicon substrate is used. A portion of this substrate is shown in FIG. 1. The memory array (both the flash EPROM and individually erasable EEPROM cells) are formed directly in this p-type substrate. The n-channel devices used in the peripheral circuits are also formed directly in the substrate. N-wells are formed in the peripheral regions of the substrate for p-channel devices used in the peripheral circuits.

The "front-end" processing includes the formation of field oxide regions 11 of FIG. 1. These regions are used for isolating devices on the substrate and are formed using well-known processing. Typically, silicon nitride masking members are used to cover regions which will subsequently contain active devices while other areas of the substrate remain exposed. In a high temperature oxidation step the field oxide regions 11 are grown. Region 11 is shown in FIG. 1 with a gate oxide layer 12 formed between the field oxide regions 11.

The gate oxide layer 12 is used as a gate oxide for the high voltage peripheral devices, for the individually erasable EEPROM cells (to separate the channel regions of these cells from the floating gates), and for select devices in these cells such as select devices 28 and 29 shown in FIG. 9. (The high voltage n-channel peripheral transistors handle the programming potential; these transistors have gates fabricated from the first layer of polysilicon.)

In FIG. *2a*, a section of the substrate 10 similar to that of FIG. *2a*, is illustrated which generally comprises a region disposed between two field oxide regions 11*a*. Prior to the processing illustrated in FIG. *2a* which will be discussed, this section of the substrate is covered with the oxide layer 12 of FIG. 1. In FIG. *2b*, another section of the substrate is illustrated again including a region disposed between two field oxide regions 11*b*. Prior to the processing shown in FIG. *2b*, this substrate section is covered with the oxide layer 12 of FIG. 1.

After the formation of the field oxide regions 11 and the gate oxide layer 12, the substrate is covered with a photoresist layer 15. An ordinary masking step is used to remove the photoresist from those regions of the substrate which will host the flash EPROM cells. Additionally, narrow openings are made such as opening 16 of FIG. *2b* in regions where the tunnel oxide is grown for the individually erasable EEPROM cells. (However, at this time the oxide 12 is not removed from opening 16.) The photoresist layer at this time also covers those regions of the individually erasable EEPROM cells which will later host the channel region of the devices, as well as the host regions for the devices 28 and 29 of FIG. 9, and like devices. Additionally, the photoresist layer 15 covers the peripheral area of the substrate to protect the gate oxide layer 12 since this layer is used as the gate oxide layer for the peripheral transistors.

Next the substrate is subjected to an ion implantation step; boron ions are implanted into the substrate through the oxide layer 12 at the regions not protected by the photoresist layer. This is done primarily to enhance the programming of the flash EPROM cells.

After this implantation, the substrate is etched and those portions of the oxide layer 12 not protected by the photoresist layer 15 are removed. Thus, for example, the substrate at region 14 of FIG. *2a* is exposed as is the substrate at the opening 16 (between oxide members 12*b* of FIG. *2b*). In all other regions where the photoresist layer covers the oxide layer 12, the oxide layer 12 remains on the substrate.

The substrate is now subjected to an oxidation step to grow a thin oxide layer. This oxide layer is a silicon dioxide layer or composite layer of high integrity and is the insulative layer through which tunnelling occurs. In the presently preferred embodiment, a thermally grown layer of approximately 110 Å is formed in an atmosphere of dry oxygen. This layer is shown in FIG. *3a* at the opening 14 as layer 17*a* and in FIG. *3b* at the opening layer 16 as layer 17*b*. The photoresist layer 15 is removed before the formation of the tunnel oxide layer.

A first layer of polysilicon is now deposited over the entire substrate. An ordinary masking step is used to form polysilicon lines which subsequently become floating gates for both the flash EPROM and individually erasable EEPROM cells. The formation of these lines is known in the prior art.

The first layer of polysilicon is removed from the peripheral area (except where it is used as gate members) and where needed threshold adjusting implants are used in the peripheral regions for adjusting the threshold voltages of the peripheral devices. Note that at this time the first layer of polysilicon is covering the channel regions of the memory cells and hence the channels of the cells do not receive any of this dopant.

An ordinary interpolysilicon dielectric is formed on the substrate to prepare the substrate for a second layer of polysilicon. Then a second layer of polysilicon is formed on the substrate and ordinary masking and etching steps are used to fabricate control gates for the flash EPROM devices as taught in the above identified application. Control gates are simultaneously formed for the individually erasable EEPROM devices as taught by the prior art. This second layer of polysilicon is also etched to form gates for the transistors for the peripheral circuits.

A portion of the second polysilicon layer extends over the oxide 17*b*. A narrow finger or member 19*b* is formed over oxide 17*b*. This is done with the same masking and etching steps used to form the control gates. Member 19*b* is used as a mask to allow finger or member 18*b* to be etched from an underlying portion of the first polysilicon layer. Members 18*b* and 19*b* are made as narrow as practical. For example, they may be 1 micron wide or less with current technologies. Member 18*b* is integral with the floating gate of the cell; one dimension of this floating gate is also formed by using the overlying control gate as a mask, as done in the prior art. Member 19*b* is integral with the control gate of the cell.

The resultant structure for a flash EPROM cell is shown in FIG. *4a*; it includes the floating gate 18*a*, the interpolysilicon dielectric 21*a* and the control gate 19*a*. In the region for the individually erasable EEPROM cell the polysilicon member 18*b* is shown covered with interpolysilicon dielectric 21*b* and with an extension of that cell's control gate 19*b* extending over the dielectric 21*b*. Both the control gate and floating gate extend over the channel region of the cell as in the prior art. (Note the channel region for the individually erasable EEPROM cell is not shown in the drawings.)

Now the source and drains for the cells and peripheral devices are formed. All the host regions for the n-type source and drain regions are left exposed and the host regions for the p-type source and drain regions are covered. Arsenic is implanted in alignment with the gates to form the source and drain regions for the n-channel devices (including the cells). The source and drain regions for the select devices of FIG. 9 are also implanted. The arsenic ions are also implanted in alignment with the polysilicon member 18of FIG. *5b* forming the regions 22*b* and 23*b*. (Prior to the ion implantation of the arsenic ions, the dielectric covering the substrate is thinned in the currently preferred process by an ordinary etching step from approximately 400 Å to 200 Å. This is done to allow the implantation of ions through the oxide. For example, layer 17*a* is thinned to approximately 200 Å.)

The flash EPROM cells as taught by the prior art employ an additional doping step at their source region to provide a more graded source junction. A masking step is used to cover the drain region of these devices as well as most source and drain regions of other devices exposing only the source regions of the flash EPROM cells and the source and drain regions of the select transistor. The only other regions exposed at this time are the regions adjacent to the polysilicon members 18*b* and 19*b*. Thus phosphorus is implanted into the substrate adjacent to the sandwich comprising members 17*b*, 18*b* and 19b. The implanted phosphorus ions diffuse more readily into the substrate thus, for example, they are shown under gate 18a and, importantly, form regions 24b under the polysilicon member 18b. (The source and drain regions of the select transistors are implanted with phosphorus in order to accommodate high voltage.)

Before the formation of the source and drain regions for the p-channel transistors of the periphery, the substrate is subjected to a reoxidation step. For example, the substrate is subjected to a temperature of 920° C. for from 4–6 hours in a dry $O_2$ atmosphere. This is typically done to oxidize, and hence protect, the edges of the gates and to activate the dopant previously implanted for the source and drain region of the n-channel devices. This reoxidation also repairs the crystalline structure of the silicon damaged by ion implantation.

During this oxidation step the dopant deposited along the polysilicon member 18b laterally diffuses under the member 18b. This is particularly true for the phosphorus dopant. As shown in FIG. 7 the doped regions 25b propagate under the polysilicon member or finger 18b. Note that the regions 25b are separated from member 18b by the relatively thin tunnel oxide 17b. Thus electrons may be readily tunnelled into and from member 18b and since this member is contiguous with the floating gate of the individually erasable EEPROM cell, this cell may be both programmed and erased. The regions 25b are contiguous with the drain region of the device. (The corresponding region of the cell described in U.S. Pat. No. 4,203,158 is also contiguous with the drain region.) However, unlike the prior art, these regions are not separately formed but rather formed by the same implantation steps used to form the source and drain regions for all the cells. (In FIG. 8 the region 25b is better illustrated as it appears under the member 18b. This view is off centered from the center line of finger 18b.)

In some cases, the finger 18b may be narrow enough so that there is a continuous doped region 25b formed under member 18b. That is, the two regions 25b shown in FIG. 7 merge. This, however, is not necessary. Cells function well with a 1.6 micron wide finger and with under diffusion of 0.5 microns on each side, leaving a gap of approximately 0.6 microns. The proximity of the two close regions 25b produces a depletion field in the substrate which reduces the substrate current during erase. In prior art cells relying on overlapping gate substrate regions current is high since close proximity of source-drain region cannot be achieved. In fact, with the present invention, substrate current is reduced by orders of magnitude (i.e., 1000× to 10,000×) when compared to these prior art cells, allowing on-chip charge pumping to be used for the high voltage.

Now a boron or other p-type dopant may be implanted after a masking step to form the source and drain regions for the p-channel transistors in the periphery circuits. Following this, ordinary "rear-end" steps are used to complete the memory such as the formation of passivation layers and metal layers.

As illustrated in FIG. 9, each of the individually erasable EEPROM cells, such as cell 32, includes a floating gate which is completely surrounded by oxide and a control gate (fabricated from the second layer of polysilicon which includes the polysilicon member 19b). The control gate is coupled to a source of potential through an n-channel transistor 29. The drain terminal of the cell is coupled to a source of potential through an n-channel transistor 28. The gates of both transistors 28 and 29 are coupled to line 30 as illustrated. (While n-channel enhancement mode transistors are currently preferred, transistors 28 and 29 could be other types of transistors such as zero threshold transistors.)

To program the floating gate of device 32 the programming potential of $V_{pp}$ is applied to lines 30 and 37. Line 38 is connected to ground; line 39 is open. For these conditions transistors 28 and 29 conduct. Electrons are tunnelled from the substrate into the floating gate. To erase the device, again the programming potential, $V_{pp}$, is applied to line 30 and transistors 28 and 29 conduct. The source terminal is again open. Line 37 is at ground potential while line 38 is at the $V_{pp}$ potential. Under these conditions, charge is tunnelled from the floating gate into the drain region.

During the reading of the cell a sense amplifier is connected to line 38. The normal operating potential $V_{cc}$ (5 V) is connected to line 30, causing transistors 28 and 29 to conduct. The reference potential is applied to lines 37 and 38 and the source region is connected to ground. Under these conditions if the floating gate is negatively charged, device 32 does not conduct. On the other hand, if the gate is not charged with electrons (or positively charged) the device 32 conducts.

It should be noted that the cell of FIG. 9 may be programmed and erased without interfering with adjacent cells.

In an alternate method the finger 19b is not formed at all. Rather the finger 18b is formed when the first layer of polysilicon is initially etched. During the phosphorus implant, finger 18b (about 0.15 μmm thick) does not prevent the ions from reaching the silicon substrate where energies of higher than 125 kev are used. This further reduces substrate current during erase since the entire region under finger 18a is implanted. The control gate still overlies the floating gate as in the prior embodiment; however, it does not extend over the finger of the floating gate.

We claim:

1. In a process for fabricating a first erasable electrical programmable read-only memory cell on a substrate, an improvement for simultaneously forming a second electrically erasable read-only memory cell on said substrate comprising the steps of:

forming a first insulative region on said substrate for said first cell while simultaneously forming a second insulative region on said substrate, said second insulative region being utilized for the tunneling of charge in said second cell;

forming a narrow polysilicon member from a layer of polysilicon deposited over said second insulative region while simultaneously forming polysilicon gates from said polysilicon layer for said first cell;

doping said substrate adjacent to said narrow polysilicon member with a first dopant while simultaneously forming source and drain regions with said first dopant for said first cell;

driving said first dopant under said narrow polysilicon member to form doped regions said doped regions being spaced-apart so as to define a narrow channel region therebetween such that electrical charge may be tunneled to and from said member through said doped regions.

2. The improvement defined by claim 1 wherein said doping is done in alignment with said polysilicon member.

3. The improvement defined by claim 2 including a second doping step wherein said source region of said first cell in said substrate adjacent to said narrow polysilicon member are doped with a second dopant.

4. The improvement defined by claim 3 wherein said second dopant comprises phosphorus.

5. In a process for fabricating a first erasable electrically programmable read-only memory cell on a substrate, an improvement for simultaneously forming a second electrically erasable and electrically programmable read-only memory cell on said substrate comprising the steps of:

forming a second insulative region on said substrate for the tunneling of charge in said second cell simultaneously with the formation of a first insulative region on said substrate for said first cell;

forming a narrow polysilicon member from a first layer of polysilicon deposited on said first and second insulative regions, said first layer forming a floating gate for said second cell, said polysilicon member extending from said floating gate of said second cell over said second insulative region, said first layer also forming a polysilicon gate for said first cell;

doping said substrate adjacent to said polysilicon member with a first dopant while simultaneously forming source and drain regions with said first dopant for said first cell;

driving said first dopant under said narrow polysilicon member to form at least one doped region under said member such that electrical charge may be tunneled to and from said floating gate of second cell through said second insulative region.

6. The improvement defined by claim 5 wherein said doping is done in alignment with said polysilicon member.

7. The improvement defined by claim 6 including a second doping step wherein said source region of said first cell and said substrate adjacent to said narrow polysilicon member are doped with a second dopant.

8. The improvement defined by claim 7 wherein said second dopant comprises phosphorus.

9. In the fabrication of a flash EPROM on a substrate simultaneously with an EPROM, said flash EPROM including a floating gate and a control gate, said floating gate including a finger which extends over a tunnel oxide region, said floating gate finger and said tunnel oxide comprising said EEPROM, an improvement in the processing for forming said EEPROM comprising the steps of:

doping said substrate with a first dopant in alignment with said floating gate finger after said floating gate finger has been formed over said tunnel oxide region;

driving said dopant under said floating gate finger, thereby forming a pair of spaced-apart doped regions for facilitating the transfer of electrical charge to and from said floating gate finger.

10. Improvement defined by claim 9 wherein at least one of said pair of spaced-apart doped regions is contiguous with the drain region of said cell.

11. In the fabrication of a first electrically erasable programmable read-only memory cell on a substrate simultaneously with a second electrically programmable and electrically erasable memory cell formed on said substrate where said second cell has a floating gate finger disposed over a thin oxide region from which charge is tunneled through said oxide region into a doped region formed in said substrate under a portion of said floating gate finger, improved processing for forming said doped region comprising the steps of:

doping said substrate adjacent to said floating gate finger of said second cell with at least one dopant;

driving the dopant under said floating gate finger thereby forming a pair of spaced-apart doped regions for facilitating the tunnelling of said charge.

12. The processing defined by claim 11 wherein said doping step comprises two ion implantation steps.

13. The processing defined by claim 12 wherein arsenic and phosphorus are used as the dopants in said ion implantation steps.

* * * * *

UNITED STATES PATENT AND TRADEMARK OFFICE

CERTIFICATE OF CORRECTION

PATENT NO. : 4,957,877

DATED : 9/18/90

INVENTOR(S) : Simon M. Tam & Stefan Lai

It is certified that error appears in the above-indentified patent and that said Letters Patent is hereby corrected as shown below:

Col. 4, line 20, delete "aplication" and insert --application--.

Col. 5, line 9, delete "2a" and insert --1--.

Col. 6, line 50, delete "18of" and insert --18b of--.

Col. 8, line 59, insert --,-- after the word "regions"

Col. 10, line 17, delete "Improvement" and insert --The improvement--.

Signed and Sealed this

Seventeenth Day of August, 1993

Attest:

BRUCE LEHMAN

*Attesting Officer*

*Commissioner of Patents and Trademarks*